(12) United States Patent
Ji et al.

(10) Patent No.: US 10,545,204 B2
(45) Date of Patent: Jan. 28, 2020

(54) NON-RESONANT MAGNETIC RESONANCE COIL AND MAGNETIC RESONANCE IMAGING SYSTEM USING THE SAME

(71) Applicant: SHANGHAI UNITED IMAGING HEALTHCARE CO., LTD., Shanghai (CN)

(72) Inventors: Ling Ji, Shanghai (CN); Shao Che, Shanghai (CN); Yunlei Yao, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 104 days.

(21) Appl. No.: 15/856,058

(22) Filed: Dec. 28, 2017

(65) Prior Publication Data

US 2019/0018089 A1 Jan. 17, 2019

(30) Foreign Application Priority Data

Jul. 17, 2017 (CN) .......................... 2017 1 0581577
Jul. 17, 2017 (CN) .......................... 2017 1 0582369
Jul. 17, 2017 (CN) .......................... 2017 1 0582372

(51) Int. Cl.
*G01R 33/34* (2006.01)
*G01R 33/36* (2006.01)

(52) U.S. Cl.
CPC ... *G01R 33/34084* (2013.01); *G01R 33/3614* (2013.01)

(58) Field of Classification Search
CPC .......... G01R 33/34084; G01R 33/3628; G01R 33/3621; G01R 33/3614; G01R 33/3657; G01R 33/34076; G01R 33/341; G01R 33/3635
See application file for complete search history.

(56) References Cited

U.S. PATENT DOCUMENTS

| 7,683,619 B2 * | 3/2010 | Smith ................... H01Q 7/005 324/307 |
| 8,207,736 B2 | 6/2012 | Chu et al. |
| 8,362,776 B2 | 1/2013 | Chu et al. |
| 9,018,955 B2 | 4/2015 | Chu et al. |

(Continued)

FOREIGN PATENT DOCUMENTS

| CN | 102096079 A | 6/2011 |
| CN | 102969562 A | 3/2013 |

(Continued)

OTHER PUBLICATIONS

International Search Report in PCT/CN2017/119389 dated Mar. 28, 2018, 4 pages.

(Continued)

*Primary Examiner* — G. M. A Hyder
(74) *Attorney, Agent, or Firm* — Metis IP LLC

(57) ABSTRACT

A magnetic resonance coil and a magnetic resonance imaging system using the same are provided. The magnetic resonance coil may include an antenna and a signal processor. The antenna may be configured to receive a radio frequency (RF) signal emitted from an object, wherein the antenna does not resonate with the RF signal. The signal processor may be coupled to the antenna configured to process the RF signal to generate a processed signal.

20 Claims, 12 Drawing Sheets

(56) References Cited

U.S. PATENT DOCUMENTS

| | | |
|---|---|---|
| 9,733,321 B2 | 8/2017 | Martius et al. |
| 2008/0258731 A1 | 10/2008 | Smith et al. |
| 2010/0277171 A1 | 11/2010 | Zhang |
| 2012/0001629 A1 | 1/2012 | Hopper et al. |
| 2012/0169335 A1 | 7/2012 | Leussler |
| 2013/0234705 A1 | 9/2013 | Mandal et al. |
| 2014/0361775 A1 | 12/2014 | Qiu et al. |
| 2017/0160356 A1 | 6/2017 | Liu |

FOREIGN PATENT DOCUMENTS

| | | |
|---|---|---|
| CN | 103213117 A | 7/2013 |
| CN | 104300205 A | 1/2015 |
| CN | 205193255 U | 4/2016 |
| CN | 107290697 A | 10/2017 |

OTHER PUBLICATIONS

Written Opinion in PCT/CN2017/119389 dated Mar. 28, 2018, 5 pages.
D. Murphree et al., An easily consturcted, tuning free, ultra-broadband probe for NMR, Journal of Magnetic Resonance, 1(188): 160-167(2017).
European Search Report in European Application No. 17210845.8 dated Jul. 19, 2018, 11 pages.

\* cited by examiner

500

900

NON-RESONANT MAGNETIC RESONANCE COIL AND MAGNETIC RESONANCE IMAGING SYSTEM USING THE SAME

CROSS-REFERENCE TO RELATED APPLICATIONS

This application claims priority of Chinese Patent Application No. 201710581577.X, filed on Jul. 17, 2017, Chinese Patent Application No. 201710582369.1, filed on Jul. 17, 2017, and Chinese Patent Application No. 201710582372.3, filed on Jul. 17, 2017, the contents of which are hereby incorporated by reference.

TECHNICAL FIELD

The present disclosure generally relates to a radio frequency (RF) coil, and more particularly, to an RF coil implemented in a magnetic resonance imaging system for receiving an RF signal emitted from an object.

BACKGROUND

Magnetic resonance imaging (MRI) is an imaging technique used in radiology to form images of the anatomy and the physiological processes of an object (e.g., a patient, or a section thereof). MRI scanners use strong magnetic fields, radio waves, and field gradients to generate images of the inner structure of the object based on the science of nuclear magnetic resonance (NMR). More particularly, certain atomic nuclei (e.g., hydrogen-1, carbon-13, oxygen-17, etc.) absorb and emit RF energy when placed in an external magnetic field. The emitted RF energy exists as RF signals and is received by the MRI scanners.

Hydrogen atoms are often used to generate a detectable RF signal that is received by an antenna of a coil in close proximity to the object being examined. Conventionally, the antenna includes capacitance, conductance, and/or resistance that provide the antenna a specific resonant frequency. When the frequency of the RF signal emitted from the object matches the resonant frequency of the antenna, the antenna resonates and receives the RF signal. Hence, the antenna has to be designed carefully so that the resonant frequency exactly matches the frequency of the RF signal emitted from the object. However, the antenna is usually deformed (bent) in use and the resonant frequency changes. When the resonant frequency no longer matches the frequency of the RF signal emitted from the object, the coil does not work as well as before and the RF signal is received at a lower quality (e.g., with a lower signal-to-noise ratio (SNR)). Therefore, it is desired to develop a coil that is able to receive the RF signal even when it is deformed.

SUMMARY

In an aspect of the present disclosure, a magnetic resonance coil is provided. The magnetic resonance coil may include an antenna configured to receive a radio frequency (RF) signal emitted from an object, wherein the antenna does not resonate with the RF signal. The magnetic resonance coil may further include a signal processor coupled to the antenna configured to process the RF signal to generate a processed signal.

In some embodiments, the antenna is a non-resonant antenna.

In some embodiments, the antenna may be made of one or more deformable conductive materials.

In some embodiments, the antenna may be a birdcage structure configured to receive the RF signal from an entire body of the object.

In some embodiments, the antenna may be a loop structure configured to receive the RF signal from a portion of the object.

In some embodiments, the signal processor may include an amplifier coupled to the antenna and configured to amplify the RF signal.

In some embodiments, the amplifier is a differential amplifier.

In some embodiments, the magnetic resonance coil may further include a matching circuit coupled between the antenna and the amplifier and configured to match an impedance of the antenna and an impedance of the amplifier.

In some embodiments, the matching circuits is a broadband matching circuit that matches the impedance of the antenna and the impedance of the amplifier over a frequency range of the broadband signals.

In some embodiments, the magnetic resonance coil may further include an adjusting circuit coupled to the amplifier and configured to adjust the magnitude of the imaginary part of impedance of the amplifier.

In some embodiments, the adjusting circuit may include at least one of a variable capacitor or a variable conductor.

In some embodiments, the signal processor may further include a filter coupled to the amplifier.

In some embodiments, the signal processor may further include a heterodyne receiver or a homodyne receiver coupled to the amplifier.

In some embodiments, the signal processor is a direct sampling structure, and the signal processor may include an analog-to-digital converter configured to convert the RF signal to a digital signal.

In some embodiments, the antenna may be configured without capacitive elements on conductive materials.

In some embodiments, the antenna may be configured with no impedance matching circuit.

In some embodiments, the amplifier may be configured with an input impedance greater than 500 Ohms.

In some embodiments, the antenna may be configured with no coupling unit, nor decoupling unit.

In some embodiments, the magnetic resonance coil may be implemented in a multi-nuclear magnetic resonance system relating to a plurality of atomic nuclei. The plurality of atomic nuclei may include phosphorus atom or sodium atom.

In another aspect of the present disclosure, a magnetic resonance imaging (MRI) system is provided. The MRI system may include a main electromagnet configured to generate a uniform magnetic field on an object, and a gradient electromagnet configured to generate a gradient magnetic field on the object. The MRI system may further include a transmitting coil configured to transmit a first radio frequency (RF) signal to the object, and a receiving coil configured to receive and process a second RF signal emitted from the object in response to the first RF signal. The receiving coil may include an antenna configured to receive a radio frequency (RF) signal emitted from an object, wherein the antenna does not resonate with the RF signal. The receiving coil may further include a signal processor coupled to the antenna configured to process the RF signal to generate a processed signal. The MRI system may include a processor configured to generate an image of the object based on the processed signal. The MRI system may include a display configured to display the generated image of the object.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting examples, in which like reference numerals represent similar structures throughout the several views of the drawings, and wherein.

DETAILED DESCRIPTION

Figure 1:
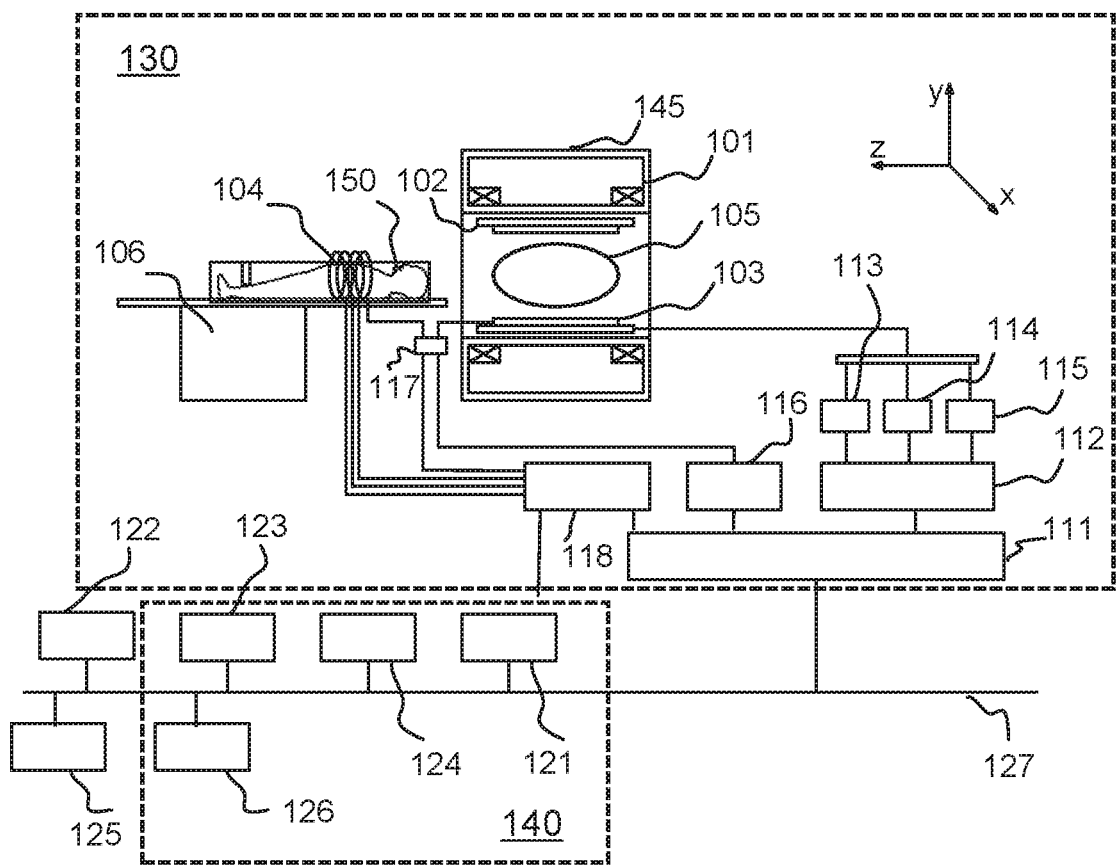
FIG. 1 is a schematic block diagram of an exemplary magnetic resonance imaging (MRI) system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirits and scope of the present disclosure. Thus, the present disclosure is not limited to the embodiments shown, but to be accorded the widest scope consistent with the claims.

It will be understood that the term "system," "unit," "module," and/or "block" used herein are one method to distinguish different components, elements, parts, section or assembly of different level in ascending order. However, the terms may be displaced by another expression if they may achieve the same purpose.

It will be understood that when a unit, module or block is referred to as being "on," "connected to" or "coupled to" another unit, module, or block, it may be directly on, connected or coupled to the other unit, module, or block, or intervening unit, module, or block may be present, unless the context clearly indicates otherwise. As used herein, the term "and/or" includes any and all combinations of one or more of the associated listed items.

The terminology used herein is for the purposes of describing particular examples and embodiments only, and is not intended to be limiting. As used herein, the singular forms "a," "an," and "the" may be intended to include the plural forms as well, unless the context clearly indicates otherwise. It will be further understood that the terms "include," and/or "comprise," when used in this disclosure, specify the presence of integers, devices, behaviors, stated features, steps, elements, operations, and/or components, but do not exclude the presence or addition of one or more other integers, devices, behaviors, features, steps, elements, operations, components, and/or groups thereof.

The present disclosure provides a magnetic resonance coil implemented in an MRI system. The present magnetic resonance coil may receive an RF signal generated by an object being examined even when it is deformed. The magnetic resonance coil may include an antenna that does not resonate with the RF signal and a signal processor coupled to the antenna configured to process the RF signal. In some embodiments, different atoms may emit RF signals at different frequencies. As the non-resonant RF antenna may receive RF signals at a wide range of frequencies, it may be used to image atoms, such as a phosphorus atom, a sodium atom, etc. besides the atoms that are commonly imaged in an MRI system (e.g., hydrogen atoms, carbon atoms, oxygen atoms). The antenna may be a birdcage structure configured to receive the RF signal from an entire body of the object or may be a loop structure configured to receive the RF signal from a portion of the object. The signal processor may be an analog signal processor or a digital signal processor. The signal processor may include an amplifier configured to amplify the received RF signal. The magnetic resonance coil may include an adjusting circuit configured to adjust the magnitude of the imaginary part of impedance of the amplifier. The input impedance of the amplifier may be greater than 500 Ohms.

FIG. 1 is a schematic block diagram of an exemplary magnetic resonance imaging (MRI) system 100 according to some embodiments of the present disclosure. As shown in FIG. 1, the MRI system 100 may include a MRI scanner 130, a computing device 140, a processing engine 122, and a storage device 125. It should be noted that the imaging system described below is merely provided for illustration purposes, and not intended to limit the scope of the present disclosure. The MRI system 100 may find its applications in various fields, such as healthcare industries (e.g., medical applications), security applications, industrial applications, etc. For example, the MRI system 100 may be used for analyzing composition of a specimen, nuclear magnetic resonance logging, or the like, or a combination thereof.

The MRI scanner 130 may include a main magnet 101, a gradient magnet 102, a volume coil 103, a local coil 104, a scanning bed 106, an pulse controller 111, a gradient signal generator 112, a first gradient amplifier 113, a second gradient amplifier 114, a third gradient amplifier 115, an RF pulse generator 116, a switch 117, and an RF signal receiver 118. A detecting region 105 may be formed in the MRI scanner 130. The detecting region 105 may be a place where the object is scanned by the MRI scanner 130.

The MRI scanner 130 may be configured to scan an imaging object 150. The MRI scanner 130 may obtain information related to the imaging object 150 by scanning the imaging object 150. More particularly, certain atomic nuclei (e.g., hydrogen-1, carbon-13, oxygen-17, etc.) may absorb and emit RF energy when being placed in the main magnetic 101 and the gradient magnet 102. The emitted RF energy exists as RF signals and is received by the MRI scanner 130. The MRI scanner 130 may reconstruct a distribution of the atomic nuclei inside the imaging object based on the RF signals as an MRI image.

The main magnet 101 may be placed in a gantry 145 of the MRI scanner. The main magnet 101 may be configured to generate a uniform main magnetic field. The strength of the main magnetic field may be 0.2 Tesla, 0.5 Tesla, 1.0 Tesla, 1.5 Tesla, 3.0 Tesla, etc. In some embodiments, the main magnet 101 may be a superconducting coil. Alternatively, the main magnet 101 may be a permanent magnet.

The scanning bed 106 may support the imaging object 150 during a scan. The object may be biological or non-biological. Merely by way of example, the object may include a patient, an organ, a specimen, a man-made object, a mold, etc. During a scan, the imaging object 150 may be supported and delivered to the detecting region 105 of the gantry 145 by the scanning bed 106. The detecting region 105 may be a region that the magnetic field distribution of the main magnetic field is relatively uniform, and to which, the RF signal is transmitted.

Merely by way of example, a spatial coordinate system (i.e., a coordinate system of the MRI scanner) may be described relative to the gantry 145 of the MRI scanner 130. For example, a Z axis may be the direction along the axis of the gantry, an X axis and a Y axis may be the directions perpendicular to the Z axis. The long-axis direction of the imaging object may coincide with the direction of the Z axis and the scanning bed 106 may move in the direction of the Z axis.

The pulse controller 111 may be configured to control the generation of RF signals. For example, the pulse controller 111 may control the RF pulse generator 116 and the gradient signal generator 112. In some embodiments, the pulse controller 111 may control the RF pulse generator 116 to generate an RF pulse. The RF pulse may be amplified by an amplifier. In some embodiments, the pulse controller 111 may control the gradient signal generator 112 to generate gradient signals.

The pulse controller 111 may receive information from or send information to the MRI scanner, the processing engine 122, and/or a display 123. According to some embodiments of the present disclosure, the pulse controller 111 may receive a command from a user via the display 123 and control components of the MRI scanner (e.g., the RF pulse generator 116) accordingly to start a scan.

The RF pulse generator 116 may generate an RF pulse. In some embodiments, the RF pulse generator 116 may generate the RF pulse based on an instruction from the pulse controller 111. The RF pulse may be amplified by an amplifier. The switch 117 may be configured to control the emission of the amplified RF pulse. For example, the amplified RF pulse may be emitted by the volume coil 103 and/or the local coil 104 when the switch 117 is on. The emitted RF pulse may excite the atomic nuclei in the imaging object 150. The imaging object 150 may generate a corresponding RF signal when the RF excitation is removed. The volume coil 103 and/or the local coil 104 may transmit RF signals to or receive RF signals from the imaging object 150. For example, the volume coil 103 and/or the local coil 104 may transmit the amplified RF pulse to the imaging object 150. For another example, the volume coil 103 and/or the local coil 104 may receive the RF signal emitted from the imaging object 150. In some embodiments, the volume coil 103 and/or the local coil 104 may include a plurality of RF receiving channels. The plurality of RF receiving channels may transmit RF signals received from the imaging object 150 to the RF signal receiver 118. In some embodiments, the volume coil 103 may be configured to transmit RF signals to or receive RF signals from the entire body of the imaging object 150 while the local coil 104 may be configured to transmit RF signals to or receive RF signals from a portion of the imaging object 150.

The volume coil 103 and/or the local coil 104 may be magnetically-insulated. In some embodiments, the volume coil 103 and the local coil 104 are non-resonant coils which do not include any capacitance. The volume coil 103 and/or the local coil 104 may be made of one or more deformable materials. For example, the volume coil 103 and/or the local coil 104 may be made of shape-memory alloy. The shape-memory alloy may recover to its original shape under a recovering condition (e.g., a high temperature, a large strain). The shape-memory alloy may include silver, cadmium, gold, nickel, titanium, hafnium, copper, zinc, or the like, or any combination thereof. For another example, the volume coil 103 and/or the local coil 104 may be made of deformable conductive materials. The deformable conductive materials may include metallic materials such as solid metals, alloys, liquid metals, etc. The liquid metals may include mercury, aluminum, cesium, gallium, rubidium, or the like, or any combination thereof.

In some embodiments, the volume coil 103 may be a large coil (e.g., a birdcage coil) that can accommodate the entire body of the imaging object 150. The local coil 104 may be a small coil (e.g., a loop coil, a solenoid coil, a saddle coil, a flexible coil, etc.) that covers a portion of the imaging object 150.

The RF signal receiver 118 may be configured to receive RF signals. The RF signal receiver 118 may receive RF signals from the volume coil 103 and/or the local coil 104.

The gradient signal generator 112 may generate gradient signals. In some embodiments, the gradient signal generator 112 may generate gradient signals based on an instruction from the pulse controller 111. The gradient signals may include three orthogonal signals. In some embodiments, the three orthogonal signals may be a first gradient signal along the X direction, a second gradient signal along the Y direction, and a third gradient signal along the Z direction. The gradient signals may help to locate the atomic nuclei.

The first gradient amplifier 113, the second gradient amplifier 114, and the third gradient amplifier 115 may be configured to amplify the gradient signals generated by the gradient signal generator 112. In particular, the first gradient amplifier 113 may amplify the first gradient signal, the second gradient amplifier 114 may amplify the second gradient signal, and the third gradient amplifier 115 may amplify the third gradient signal, respectively.

The gradient magnet 102 (also called gradient coil 102) may be configured to spatially encode RF signals (e.g., an RF pulse generated by the RF pulse generator 116). The gradient magnet 102 may generate a magnetic field with a strength less than that of the main magnetic field. For example, the gradient magnet 102 may generate a gradient magnet field in the detecting region 105.

In some embodiments, the MRI scanner 130 may include both a volume coil 103 and a local coil 104. For example, the volume coil 103 may be configured to emit RF signals, and the local coil may be configured to receive RF signals, or vice versa. The volume coil 103 and the local coil 104 may each include an amplifier with a high input impedance value, respectively. The amplifiers with high input impedance may decouple the volume coil and the local coil without additional decoupling methods.

The computing device 140 may include a reconstruction module 121, the display 123, an input/output (I/O) 124, and a communication port 126.

The reconstruction module 121 may be configured to reconstruct an MRI image. The reconstruction module 121 may reconstruct an MRI image based on RF signals received by the RF signal receiver 118.

The display 123 may be configured to display images. The display 123 may include a liquid crystal display (LCD), a light emitting diode (LED)-based display, or any other flat panel display, or may use a cathode ray tube (CRT), a touch screen, or the like. A touch screen may include, e.g., a resistor touch screen, a capacity touch screen, a plasma touch screen, a vector pressure sensing touch screen, an infrared touch screen, or the like, or a combination thereof.

The I/O 124 may input and/or output signals, data, information, etc. The input and/or output information may include programs, software, algorithms, data, text, number, images, voice, or the like, or any combination thereof. For example, a user or an operator may input some initial parameters or conditions to initiate a scan. As another example, some information may be imported from an external resource, such as a floppy disk, a hard disk, a wireless terminal, or the like, or any combination thereof. In some embodiments, the I/O 124 may enable a user interaction with the processing engine 122. In some embodiments, the I/O 124 may include an input device and an output device. Examples of the input device may include a keyboard, a mouse, a touch screen, a control box, a microphone, or the like, or a combination thereof. Examples of the output device may include a display device, a loudspeaker, a printer, a projector, or the like, or a combination thereof.

The communication port 126 may be connected to a network (not shown) to facilitate data communications. The communication port 126 may establish connections between an external device, an image acquisition device, a database, an external storage, and an image processing workstation, etc. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ connection, a Wi-Fi™ connection, a WiMax™ connection, a WLAN connection, a ZigBee connection, a mobile network connection (e.g., 3G, 4G, 5G, etc.), or the like, or a combination thereof. In some embodiments, the communication port 126 may include a standardized communication port, such as RS232, RS485, etc. In some embodiments, the communication port 126 may be a specially designed communication port. For example, the communication port 126 may be designed in accordance with the digital imaging and communications in medicine (DICOM) protocol.

The processing engine 122 may process different kinds of information. For example, the processing engine 122 may process RF signals received from the RF signal receiver 118 to the reconstruction module 121 to generate one or more images based on these signals and sent the images to the display 123. In some embodiments, the processing engine 122 may process data input by a user or an operator via the display 123 and/or the I/O 124, transform the data into specific commands, and supply the commands to the pulse controller 111. The processing engine 122 may include one or more processors.

The storage device 125 may store data relating to the MRI system 100. The data may be data files related to processing and/or communication, program command to be executed by the processor engine 112, a numerical value, an image, information of an object, an instruction and/or a signal to operate the MRI system 100, voice, a model relating to a patient, an algorithm relating to an image processing technique, or the like, or a combination thereof. Exemplary numerical values may include a threshold, a MR value, a value relating to a coil, or the like, or a combination thereof. Exemplary images may include a raw image or a processed image (e.g., an image after pretreatment). Exemplary models relating to a patient may include the background information of the patient, such as, ethnicity, citizenship, religion, gender, age, matrimony state, height, weight, medical history (e.g., history relating to different organs, or tissues), job, personal habits, or the like, or a combination thereof.

The storage device 125 may include a random access memory (RAM), a read-only memory (ROM), or the like, or a combination thereof. The random access memory (RAM) may include a dekatron, a dynamic random access memory (DRAM), a static random access memory (SRAM), a thyristor random access memory (T-RAM), a zero capacitor random access memory (Z-RAM), or the like, or a combination thereof. The read only memory (ROM) may include a bubble memory, a magnetic button line memory, a memory thin film, a magnetic plate line memory, a core memory, a magnetic drum memory, a CD-ROM drive, a hard disk, a flash memory, or the like, or a combination thereof. The storage device 125 may be a removable storage device such as a chip disk that may read data from and/or write data to the reconstruction module 121 in a certain manner. The storage device 125 may also include other similar means for providing computer programs or other instructions to operate the modules/units in the MRI system 100. The storage device 125 may be operationally connected to one or more virtual storage resources (e.g., a cloud storage, a virtual private network, other virtual storage resources, etc.) for transmitting or storing the data into the one or more virtual storage resources.

In some embodiment, the pulse controller 111, the reconstruction module 121, the processing engine 122, the display 123, the I/O 124, the storage device 125, and the communication port 126 may transmit data to each other via a communication bus 127 to control an imaging process of the MRI scanner 130.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the storage device 125 may be a database including cloud computing platforms, such as a public cloud, a private cloud, a community and hybrid clouds, etc. As another example, the pulse controller 111, the processing engine 122, and/or the display 123 may be integrated into an MRI console (not shown). Users may set parameters in MRI scanning, control the imaging procedure, view the images produced through the MRI console. However, those variations and modifications do not depart the scope of the present disclosure.

Figure 2:
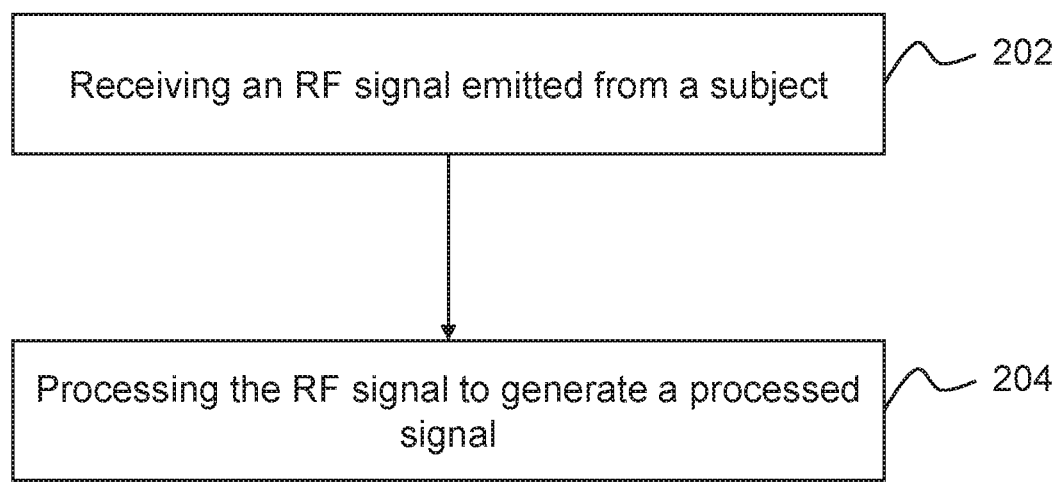
FIG. 2 is a flowchart illustrating an exemplary process for processing an RF signal according to some embodiments of the present disclosure.

FIG. 2 is a flowchart illustrating an exemplary process for processing an RF signal according to some embodiments of the present disclosure. In some embodiments, a process 300 may be implemented in the MRI system 100 as illustrated in FIG. 1.

In 202, an RF signal emitted from an object may be received by an RF receiving coil. The RF receiving coil may be a non-resonant coil. The object may be biological or non-biological. Merely by way of example, the object may include a patient, an organ, a specimen, a man-made object, a mold, etc. The RF signal may be an analog signal or a digital signal. As mentioned in FIG. 1, the object may be placed in a magnetic field and a volume coil 103 and/or a local coil 104 may transmit an RF signal to the object. The transmitted RF signal may excite atomic nuclei in the imaging object 150. The imaging object 150 may generate a corresponding RF signal when the RF excitation is removed. The object may emit the RF signal based on relaxation properties of atomic nuclei therein. The atomic nuclei may include hydrogen-1, carbon-13, oxygen-17, sodium 23, phosphorus-31, or the like, or any combination thereof.

In 204, the received RF signal may be processed to generate a processed signal. In some embodiments, the processing engine 122 may first process the RF signal and then convert the processed RF signal to a digital signal. For example, the processing engine 122 may amplify the RF signal, filter the amplified RF signal to generate a processed RF signal, and then convert the processed RF signal to a digital signal. In some embodiments, the processing engine 122 may convert the RF signal to a digital RF signal before processing the signal. For example, an analog-to-digital converter may be configured to convert the RF signal to a digital signal. Digital signal processing may include procedures of signal amplification, frequency conversion, filtering, notch, or the like, or any combination thereof.

Figure 3:
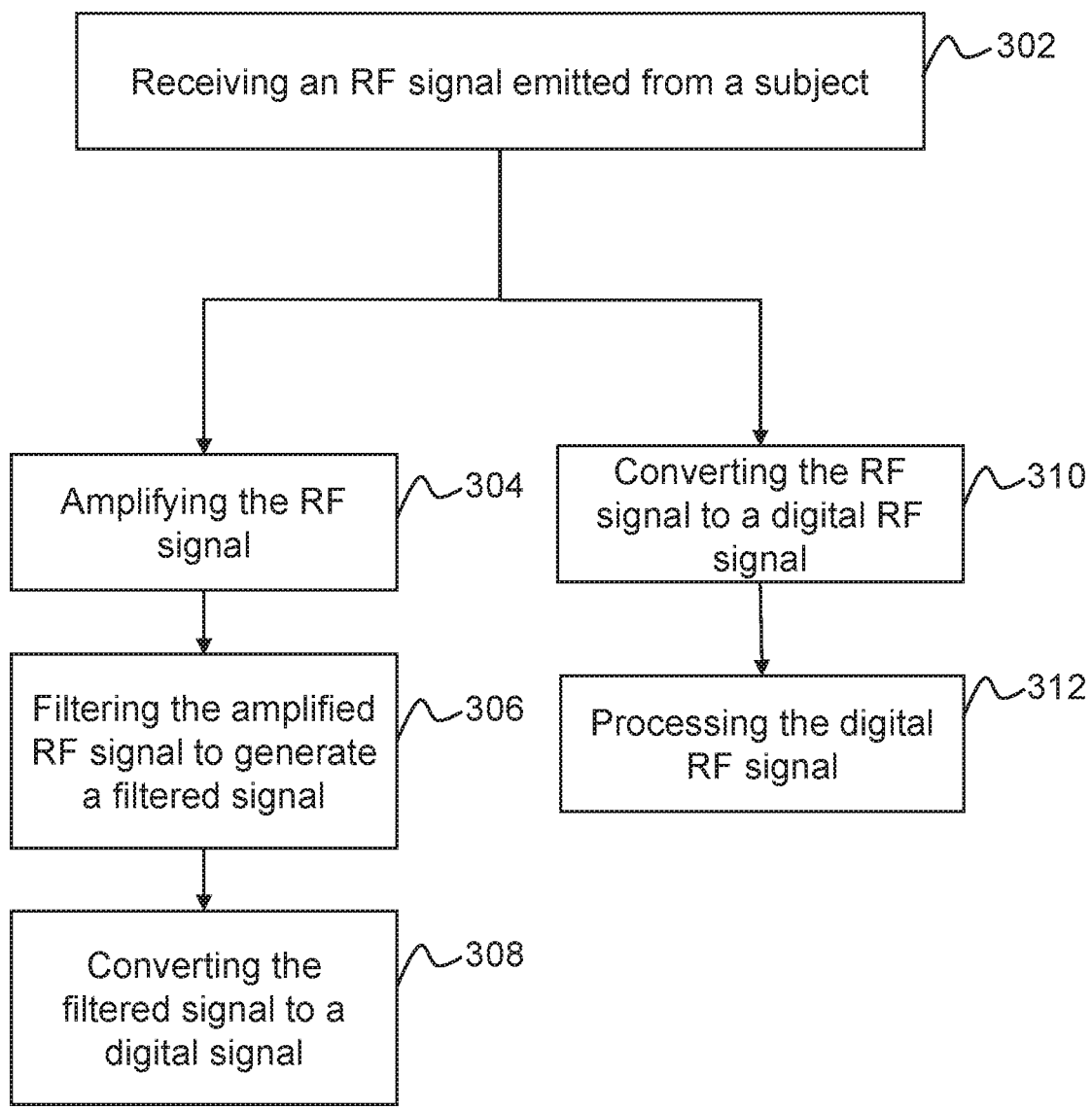
FIG. 3 is a flowchart illustrating an exemplary process for processing an RF signal according to some embodiments of the present disclosure.

FIG. 3 is a flowchart illustrating an exemplary process for processing an RF signal according to some embodiments of the present disclosure. In some embodiments, the process 300 may be implemented in the MRI system 100 as illustrated in FIG. 1.

In 302, an RF signal emitted from an object may be received by a RF receiving coil (e.g., volume coil 103, local coil 104, etc.). The RF receiving coil may be a non-resonant coil. The object may be biological or non-biological. Merely by way of example, the object may include a patient, an organ, a specimen, a man-made object, a mold, etc. The RF signal may be an analog signal or a digital signal. As mentioned in FIG. 1, the object may be placed in a magnetic field and a volume coil 103 and/or a local coil 104 may transmit an RF signal to the object. The transmitted RF signal may excite atomic nuclei in the imaging object 150. The imaging object 150 may generate a corresponding RF signal when the RF excitation is removed. The object may emit the RF signal based on relaxation properties of atomic nuclei therein. The atomic nuclei may include hydrogen-1, carbon-13, oxygen-17, sodium 23, phosphorus-31, or the like, or any combination thereof.

In some embodiments, the RF signal may be an analog signal. The RF signal may be converted to a digital signal before further processing (see, e.g., step 304 to step 308). In some embodiments, the RF signal may be processed before converted to a digital signal (see, e.g., step 310 to step 312).

In 304, the RF signal may be amplified. The processing engine 122 may control an amplifier to amplify the RF signal. The amplifier may be coupled to the RF receiving coil. The amplifier may be a low noise amplifier. The low noise amplifier may be a component of an analog signal processor (e.g., an analog signal processor 403). In some embodiments, a matching circuit (e.g., a matching circuit 1003) may be configured to match an impedance of the RF receiver with an impedance of the amplifier.

In 306, the amplified RF signal may be filtered to generate a filtered signal. The processing engine 122 may control a filter to filter the amplified RF signal. In some embodiments, the filter may be coupled to an amplifier directly. For example, a low-pass filter may be directly connected to the amplifier and filter the amplified RF signal. In some embodiments, the filter may be coupled to a down converter coupled to the amplifier. For example, the filter may be a channel selection filter (or a bandpass filter) coupled to a down converter. In some embodiments, the filer may be a portion of an analog signal processor.

In 308, the filtered signal may be converted to a digital signal. The processing engine 122 may control an analog-to-digital converter (e.g., an analog-to-signal converter 903) to convert the filtered signal to a digital signal. In some embodiments, the analog-to-digital converter may be coupled to an analog signal processor.

In 310, the RF signal may be converted to a digital signal. The RF signal may be an analog signal. The processing engine 122 may control an analog-to-digital converter to convert the RF signal to a digital signal. The analog-to-digital converter may be coupled to an RF receiving coil directly.

In 312, the digital signal may be processed. The processing engine 112 may control a digital signal processor to process the digital signal. The digital processor may be coupled to the analog-to-digital converter. The signal processing may include procedures of signal amplification, frequency conversion, filtering, notch, or the like, or any combination thereof.

It should be noted that the flowchart described above is provided for the purposes of illustration, not intended to limit the scope of the present disclosure. For persons having ordinary skills in the art, multiple variations and modifications may be reduced to practice in the light of the present disclosure. However, those variations and modifications do not depart from the scope of the present disclosure. For example, other analog or digital signal processing methods may be added or may replace the current operations in the process 300.

Figure 4:
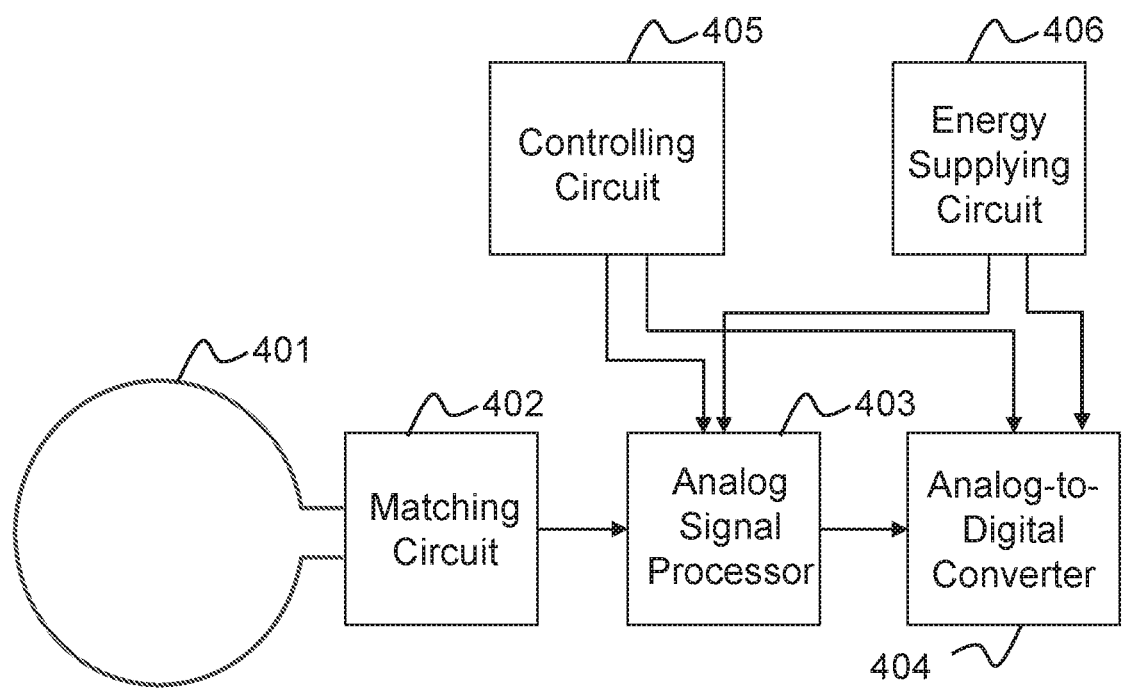
FIG. 4 is a schematic diagram illustrating an exemplary magnetic resonance RF coil according to some embodiments of the present disclosure.

FIG. 4 is a schematic diagram illustrating an exemplary magnetic resonance RF coil according to some embodiments of the present disclosure. As shown, the magnetic resonance RF coil 400 may include an RF antenna 401, a matching circuit 402, an analog signal processor 403, an analog-to-digital converter 404, a controlling circuit 405, and an energy supplying circuit 406. It should be noted that the magnetic resonance RF coil described herein is merely provided for illustrative purposes, and not intended to limit the scope of the present disclosure. The magnetic resonance RF coil 400 may find its applications in various fields, such as healthcare industries (e.g., medical applications), security applications, industrial applications, etc. For example, the magnetic resonance RF coil 400 may be used for internal inspections of components including, e.g., flaw detection, security scanning, failure analysis, metrology, assembly analysis, void analysis, wall thickness analysis, or the like, or a combination thereof.

The RF antenna 401 may be configured to receive RF signals from an object (e.g., the imaging object 150). In some embodiments, the RF antenna 401 may be a non-resonant RF antenna. For example, the RF antenna 401 may not include any capacitive components and may not resonant at a fixed frequency. Instead, the RF antenna 401 may be configured to resonant and receive signals at a wide range of frequencies (broadband signals). Merely by way of example, an antenna of a 1.5T MRI system that includes capacitance may resonant at a frequency fixed at, for example, about 64 MHz. However, the RF antenna 401 may resonant at a frequency range, e.g., from 57 MHz to 74 MHz. Besides the atoms that are commonly imaged in an MRI system (e.g., hydrogen atoms, carbon atoms, oxygen atoms), the non-resonant RF antenna 401 may be used to image atoms, such as a phosphorus atom, a sodium atom, etc. The RF antenna 401 may be in a structure of a loop, a solenoid, a saddle, or the like.

The matching circuit 402 may be electrically connected to the RF antenna 401. The matching circuit 402 may be configured to match the impedance of the RF antenna 401 and that of the analog signal processor 403 to reduce the noise generated in the RF coil 400. In some embodiments, the matching circuit 402 may be a broadband matching circuit which may match the impedance of the radio frequency antenna 401 and the analog signal processor 403 over a frequency range of the broadband signals.

The analog signal processor 403 may be electrically coupled to the matching circuit 402. The analog signal processor 403 may be configured to process an analog signal received by the RF antenna 401. For example, the signal process may include procedures of sampling, analog signal amplification, filtering, phase shifting, notch, or the like, or a combination thereof.

The analog-to-digital converter 404 may be configured to convert an analog signal to a digital signal. The analog-to-digital converter 404 may be configured to pre-process the digital signal. For example, the analog-to-digital converter 404 may compress a digital signal. For another example, the analog-to-digital converter 404 may adjust a digital signal. The analog-to-digital converter 404 may be connected to a cable, a fiber optic or a wireless means, via which the digital signal is to be transmitted.

The controlling circuit 405 may be configured to control the analog signal processor 403 and the analog-to-digital converter 404. The controlling circuit 405 may include a timing circuit with a clock signal. The clock signal may be configured to control an analog-to-digital sampling in the analog-to-digital converter 404. The clock signal may also control the RF coil 401 regarding the acquisition of RF signals.

The energy supplying circuit 406 may be configured to transmit electrical power (energy) to the analog signal processor 403 and the analog-to-digital converter 404. The energy supplying circuit 406 may include a battery pack. The battery pack may supply power to the analog signal processor 403 and the analog-to-digital converter 404. In some embodiments, the energy supplying circuit 406 may be configured to supply power to circuits other than analog signal processor 403 and the analog-to-digital converter 404 of the RF coil 400. For example, the energy supplying circuit 406 may supply power to the controlling circuit 405. In some embodiments, the energy supplying circuit 306 may be rechargeable. The energy supplying circuit 406 may be recharged by e.g., a portable power supply, a direct current (DC) cable or a wireless charging device.

In some embodiments, the RF antenna 401 may be a non-resonant antenna and the low noise amplifier may be configured with a high input impedance value. Conventionally, a coupling circuit may be configured to resonate at a center frequency, and a decoupling circuit may be configured to maintain a receiving coil in a non-working state when a transmitting coil is emitting signals. Due to the high input impedance of the low noise amplifier, coupling/decoupling circuits between coils of the RF antenna may be removed, and a signal to noise ratio of RF signals may be improved. Also due to the high input impedance of the low noise amplifier, a matching network for matching the input impedance of an RF antenna and the coupling circuit may be omitted.

In some embodiments, the low noise amplifier with a high input impedance value may be configured to receive and output differential signals, avoiding the generation of common-mode signals during signal transmissions. The common-mode signals may cause unwanted coupling and signal-to-noise ratio (SNR) loss. The coils may be the volume coils 103, the local coils 104, the gradient coil 102, or the like, or a combination thereof.

Figure 5:
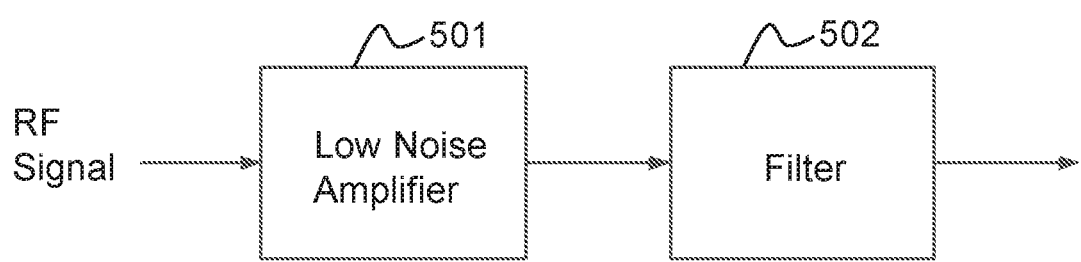
FIG. 5 is a schematic diagram illustrating an exemplary analog signal processor according to some embodiments of the present disclosure.

FIG. 5 is a schematic diagram illustrating an exemplary analog signal processor according to some embodiments of the present disclosure. As shown in FIG. 5, the analog signal processor 500 may include a low noise amplifier 501 and a filter 502.

The analog signal processor 500 may be configured to amplify and filter an RF signal received from the RF antenna 401. The low noise amplifier 501 may directly sample the RF signal received from the RF antenna 401. The direct sampling architecture may reduce the need of the number of analog devices. The performance of the direct sampling architecture may depend on the processing capacity of the analog-to-digital converter, i.e., a speed and a number of bits of an analog-to-digital converter. The low noise amplifier 501 may be a low noise amplifier with a high gain. The filter 502 may be configured to filter the amplified RF signal. The filter 502 may be a low-pass filter or a bandpass filter.

Figure 6:
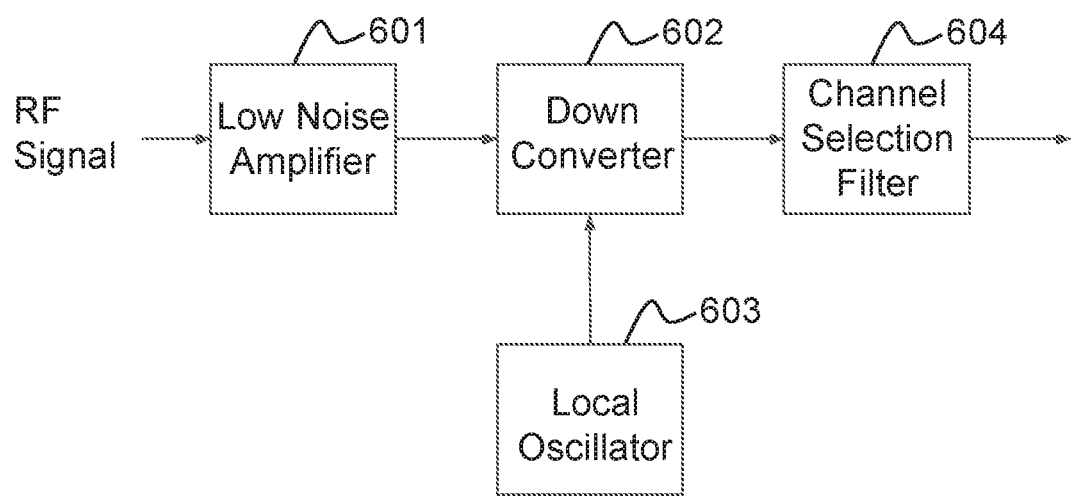
FIG. 6 is a schematic diagram illustrating an exemplary analog signal processor according to some embodiments of the present disclosure.

FIG. 6 is a schematic diagram illustrating an exemplary analog signal processor according to some embodiments of the present disclosure. As shown in FIG. 6, the analog signal processor 600 may include a low noise amplifier 601, a down converter 602, a local oscillator 603 and a channel selection filter 604.

The analog signal processor 600 may be a heterodyne receiver. The heterodyne receiver may convert a received signal (e.g., an amplified RF signal generated by the low noise amplifier 601) to an intermediate frequency. The intermediate frequency may satisfy a frequency requirement of subsequent components.

The low noise amplifier 601 may be configured to amplify an RF signal received by an RF antenna. The amplification may be linear or nonlinear. The local oscillator 603 may be configured to generate a local oscillation signal to be supplied to the low noise amplifier 601.

The down converter 602 may include or may be coupled to a mixer. The mixer may be configured to mix the amplified RF signal and the local oscillation signal. Merely by way of example, the frequency of RF signal may be expressed as $f_{IF}$ and the frequency of the location oscillation signal may be expressed as $f_{LO}$. The mixer may generate two signals at $f_{LO}+f_{IF}$ and $f_{LO}-f_{IF}$, respectively. In some embodiments, the down converter 602 may retain and output the signal at $f_{LO}-f_{IF}$ (which is the intermediate frequency). The channel selection filter 604 may be configured to filter the output signal of the down converter 602. In some embodiments, an interference signal may occur at $2f_{IF}-f_{LO}$ (also called an image frequency). The channel selection filter 604 may be a bandpass filter to remove the interference signal.

Figure 7:
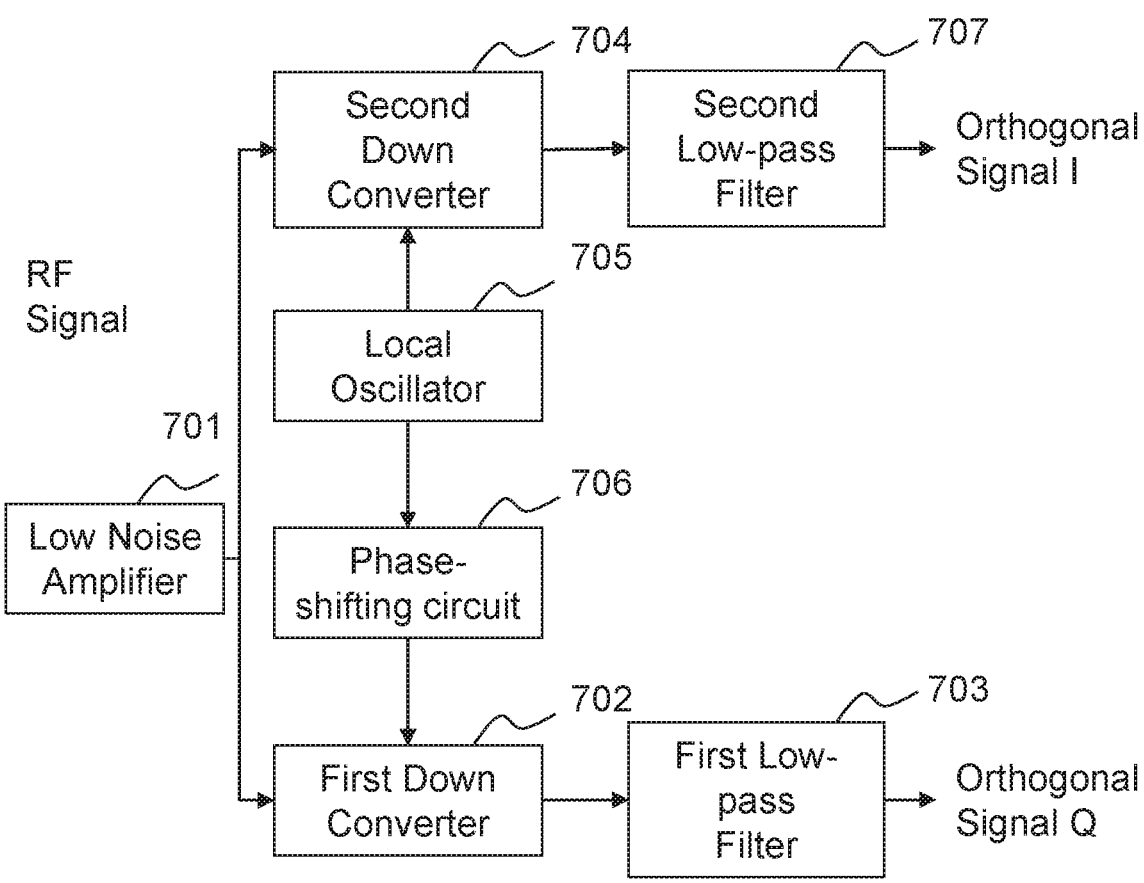
FIG. 7 is a schematic diagram illustrating an exemplary analog signal processor according to some embodiments of the present disclosure.

FIG. 7 is a schematic diagram illustrating an exemplary analog signal processor according to some embodiments of the present disclosure. As shown in FIG. 7, the analog signal processor 700 may include a low noise amplifier 701, a first down converter 702, a first low-pass filter 703, a second down converter 704, a local oscillator 705, a phase-shifting circuit 706, and a second low-pass filter 707.

The analog signal processor 700 may be a homodyne receiver. As used herein, a homodyne receiver may refer to a direct down-converting receiver. The carrier frequency of a homodyne receiver (frequency of RF signal) may be the same as a local frequency (e.g., the frequency of a local oscillation signal generated by the local oscillator 705).

The homodyne receiver may be related to an orthogonal down-conversion. The orthogonal down-conversion may produce an orthogonal signal I and an orthogonal signal Q. The orthogonal signal I and the orthogonal signal Q may have same amplitude but different phase. The orthogonal down-conversion may be realized based on the first down converter 702, the first low-pass filter 703, the second down converter 704, the local oscillator 705, the phase-shifting circuit 706, and the second low-pass filter 707. The low noise amplifier 701 and the local oscillator 705 may be similar with the low noise amplifier 601 and the local oscillator 603, and are not repeated herein. In some embodiments, the local oscillator 705 may generate a local oscillation signal at a frequency of the received RF signal. The phase-shifting circuit 706 may shift the local oscillation signal by 90 degrees (the amplitude and frequency remain unchanged) to generate a phase shifted local oscillation signal.

The first down converter 702 may be configured to convert an amplified RF signal (e.g., an RF signal amplified by the low noise amplifier 701) to a zero frequency signal based on a phase shifted local oscillation signal. The method of mixing the phase shifted local oscillation signal and the amplified RF signal is similar to those described in FIG. 6 and is not repeated herein. An output of the first down converter 702 may be input to the first low-pass filter 703 to generate the orthogonal signal I.

Similarly, the second down converter 704 may be configured to convert an amplified RF signal (e.g., an RF signal amplified by the low noise amplifier 701) to a zero frequency signal based on a local oscillation signal. An output of the second down converter 704 may be input to the second low-pass filter 707 to generate the orthogonal signal Q.

In some embodiments, the low noise amplifier may be configured with high input impedance. As used herein, the high input impedance may refer to the value of input impedance being greater than 500 Ohms, 1000 Ohms, or 2000 Ohms. The low noise amplifier with high input impedance may be realized by a field effect transistor (FET), a high electron mobility transistor (HEMT), or the like, or a combination thereof.

Figure 8:
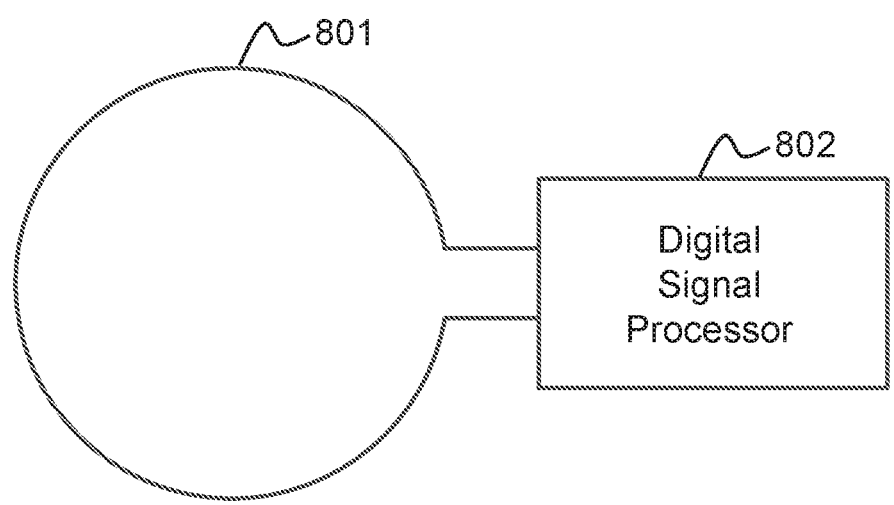
FIG. 8 is a schematic diagram illustrating an exemplary magnetic resonance RF coil according to some embodiments of the present disclosure.

FIG. 8 is a schematic diagram illustrating an exemplary magnetic resonance RF coil according to some embodiments of the present disclosure. As shown, the magnetic resonance RF coil 800 may include an RF antenna 801 and a digital signal processor 802.

The RF antenna 801 may be a loop structure. The digital signal processor 802 may include an analog-to-digital sampling circuit. The analog-to-digital sampling circuit may be configured to directly convert an analog signal (e.g., an RF signals received by the RF antenna 801) to a digital signal. In some embodiments, the digital signal processor 802 may process the sampled digital signal, the processing including procedures of signal amplification, frequency conversion, filtering, notch. Based on magnetic resonance RF coil 800, analog components may be omitted, and more space of the RF coil 800 may be saved, allowing the designing of the RF coil 800 to be more diversified.

Figure 9:
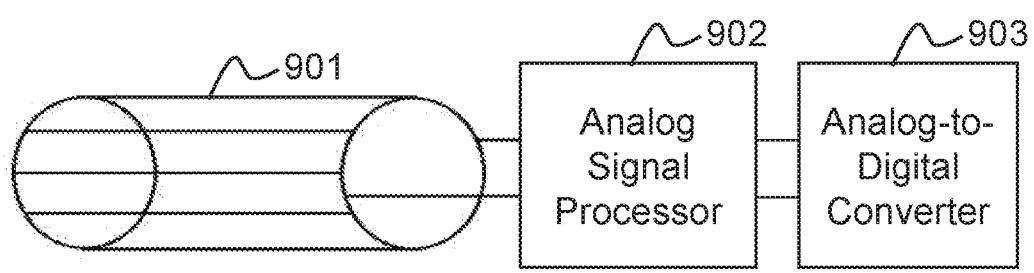
FIG. 9 is a schematic diagram illustrating an exemplary magnetic resonance RF coil according to some embodiments of the present disclosure.

FIG. 9 is a schematic diagram illustrating an exemplary magnetic resonance RF coil according to some embodiments of the present disclosure. As shown, the magnetic resonance RF coil 900 may include an RF antenna 901, an analog signal processor 902 and an analog-to-digital converter 903. The RF antenna 901 may be in a birdcage structure. The analog signal processor 902 and the analog-to-digital converter 903 may be similar to the analog signal processor 403 and the analog-to-digital converter 404, respectively, and are not repeated herein.

Figure 10:
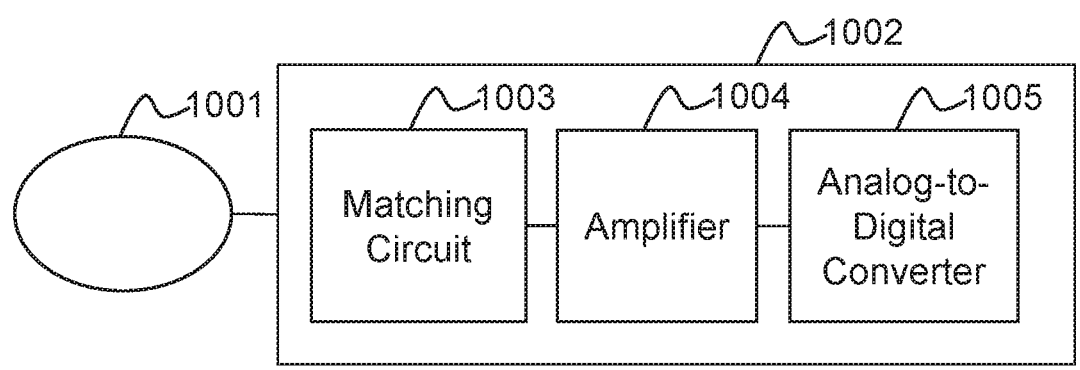
FIG. 10 is a schematic diagram illustrating an exemplary magnetic resonance RF coil according to some embodiments of the present disclosure.

FIG. 10 is a schematic diagram illustrating an exemplary magnetic resonance RF coil 1000 according to some embodiments of the present disclosure. As shown, the magnetic resonance RF coil 1000 may include a magnetic resonance RF coil 1001 and a signal processor 1002.

The magnetic resonance RF coil 1001 may be configured to receive RF signals. The RF signals may be emitted by the imaging object 150. In some embodiments, the magnetic resonance RF coil 1001 may be an RF volume coil. The RF volume coil may be in a structure of a birdcage. The RF volume coil may be placed inside the gantry 145 of the MRI scanner and encompass the entire body of the imaging object 150. In some embodiments, the magnetic resonance RF coil 1001 may be a local coil. The local coil may be configured to encompass a portion of the body of the imaging object 150, for example, a head, a wrist, a shoulder, a spine, a foot, or the like, or a combination thereof. The magnetic resonance RF coil 1001 may be made of one or more deformable materials. For example, the magnetic resonance RF coil 1001 may be made of shape-memory alloy. The shape-memory alloy may recover to its original shape under a recovering condition (e.g., a high temperature, a large strain). The shape-memory alloy may include silver, cadmium, gold, nickel, titanium, hafnium, copper, zinc, or the like, or any combination thereof. For another example, the magnetic resonance RF coil 1001 may be made of deformable conductive materials. The deformable conductive materials may include metallic materials such as solid metals, alloys, liquid metals, etc. The liquid metals may include mercury, aluminum, cesium, gallium, rubidium, or the like, or any combination thereof. In some embodiments, the magnetic resonance RF coil 1001 may be a single-channel coil, for example, a coil with one loop. In some embodiments, the magnetic resonance RF coil 1001 may be a coil array with a plurality channels. The number of channels may be 8, 16, 32, 64, etc.

The signal processor 1002 may be configured to process the RF signals received by the magnetic resonance RF coil 901. The processing may include procedures of analog signal amplification, filtering, notch, frequency conversion, analog-to-digital conversion, or the like, or a combination thereof.

The signal processor 1002 may include a matching circuit 1003, an amplifier 1004 and an analog-to-digital converter 1005. The matching circuit 1003 may be coupled to the magnetic resonance RF coil 1001 and the amplifier 1004. The matching circuit 1003 may be configured to match impedance of the magnetic resonance RF coil 1001 and impedance of the amplifier 1004. The amplifier 1004 may be configured to amplify the signal received by the magnetic resonance RF coil 1001. The analog-to-digital converter 1005 may be similar to the analog-to-digital converter 404, and is not repeated herein.

Figure 11:
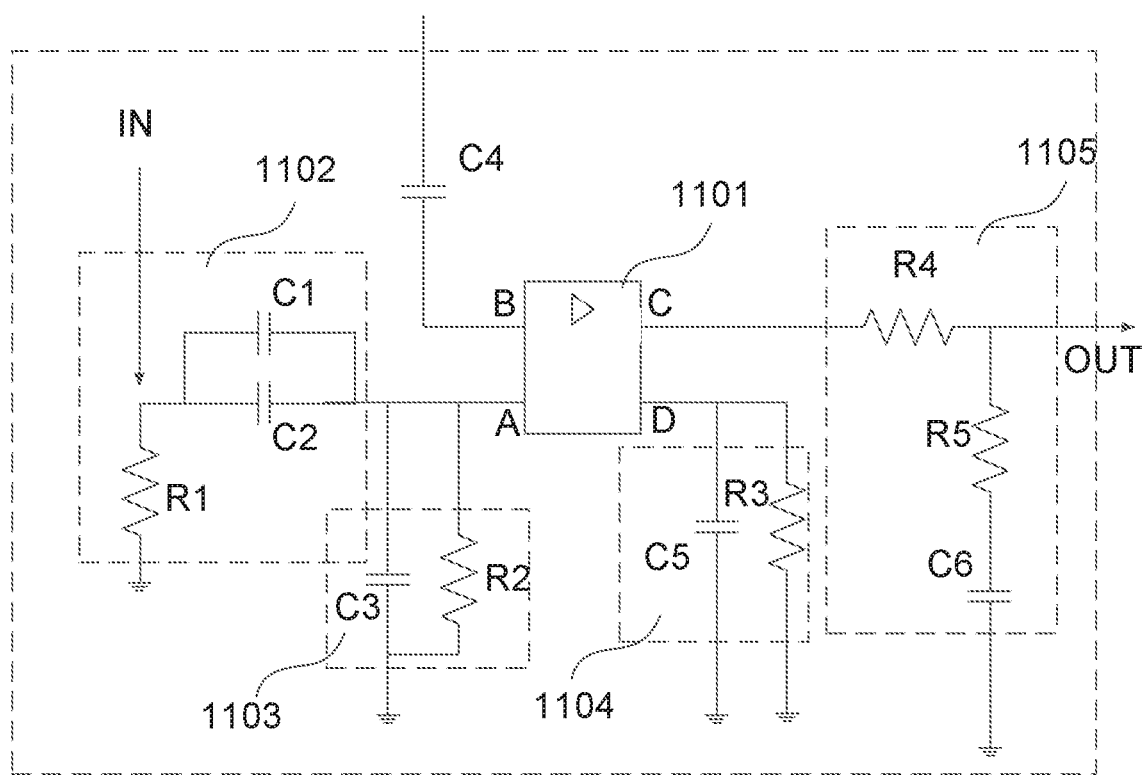
FIG. 11 is a schematic diagram illustrating an exemplary amplifying circuit according to some embodiments of the present disclosure.

FIG. 11 is a schematic diagram illustrating an exemplary amplifying circuit according to some embodiments of the present disclosure. As shown, the amplifying circuit 1100 may include an amplifier 1101, a first adjusting circuit 1102, a second adjusting circuit 1103, a bias circuit 1104, and a third adjusting circuit 1105. The amplifying circuit 1100 (or the amplifier 1101) may correspond to the amplifier described elsewhere in the present disclosure (e.g., low noise amplifier 501, low noise amplifier 601, low noise amplifier 701, amplifier 1004).

The amplifier 1101 may be configured to amplify an RF signal. The amplifier 1101 may include a first port A, a second port B, a third port C, and a fourth port D. The first port A may be an input port of the amplifier 1101. The third port C may be an output port of the amplifier 1101. The second port B and the fourth port D may be bypass ports of the amplifier 1101. The bypass ports may be configured to distribute power or bias a circuit.

The first adjusting circuit 1102 may be configured to receive an RF signal (e.g., an RF signal received by an RF coil). The first adjusting circuit 1102 may be electrically coupled to an input port of the amplifying circuit 1100 (e.g., the first port A). The first adjusting circuit 1102 may be configured to adjust a value of an input impedance of the amplifier 1101. For example, the first adjusting circuit 1102 may be configured to adjust the value of the input impedance of the amplifier 1101 to a real value (e.g., remove the imaginary part of the impedance of the amplifier 1101). The first adjusting circuit 1102 may include adjustable components. For example, the first adjusting circuit 1102 may include a first resistor R1, a first capacitor C1, and a second capacitor C2. The first capacitor C1 and the second capacitor C2 may be variable capacitors. The capacitance of a variable capacitor may be mechanically controlled or electronically controlled. A mechanically controlled capacitor may include a vacuum variable capacitor, a butterfly capacitor, a split stator variable capacitor, a differential variable capacitor, or the like, or a combination thereof. An electrically controlled capacitor may include a voltage tuned variable capacitor, an integrated circuit (IC) variable capacitor, or the like, or a combination thereof.

Similar to the first adjusting circuit 1102, the second adjusting circuit 1103 may also be electrically connected to an input port A of the amplifier 1101. The second adjusting circuit 1103 may include adjustable components. For example, the second adjusting circuit 1103 may include a second resistor R2 and a third capacitor C3 and the third capacitor C3 may be a variable capacitor. The second adjusting circuit 1103 may also be configured to adjust the value of the input impedance of the amplifier 1101 to a real value The bias circuit 1104 may be configured to distribute power. The bias circuit 1104 may be electrically connected to a bypass port of the amplifier 1101 (e.g., the fourth port D). The bias circuit 1104 may include a third resistor R3 and a fifth capacitor R5.

The third adjusting circuit 1105 may be configured to receive an amplified RF signal from the amplifier 1101. The third adjusting circuit 1105 may be electrically connected to a bypass port of the amplifier 1101 (e.g., the fourth port D). The third adjusting circuit 1105 may be configured to adjust a value of an output impedance of the amplifier 1101. For example, the third adjusting circuit 1105 may be configured to adjust the value of the output impedance of the amplifier 1101 to a real value. The third adjusting circuit 1105 may include adjustable components. For example, the third adjusting circuit 1105 may include a fourth resistor R4, a fifth resistor R5 and a sixth capacitor C6. The sixth capacitor C6 may be a variable capacitor.

In some embodiments, the input impedance of the amplifier 1101 may be determined based on the first adjusting circuit 1102 and the second adjusting circuit 1103. The input impedance of the amplifier 1101 may be determined by the impedance of the first adjusting circuit 1102 and the second adjusting circuit 1103 according to a double terminal network described in FIG. 12. The value of the input impedance of the amplifier 1101 may be expressed in the form of a first complex number. The magnitude of the imaginary part of the first complex number may be set to 0 by adjusting capacitances of the first capacitor C1, the second capacitor C2, and/or the third capacitor C3.

In some embodiments, the output impedance of the amplifier 1101 may be determined based on the third adjusting circuit 1105. The output impedance of the amplifier 1101 may be determined by impedance of the third adjusting circuit 1105 according to the double terminal network described in FIG. 12. The value of the output impedance of the amplifier 1101 may be expressed in the form of a second complex number. The magnitude of the imaginary part of the second complex number may be set to 0 by adjusting the capacitance of the sixth capacitor C6.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the adjustable component configured to adjust the input impedance and the output impedance of the amplifier 1101 may also be a variable inductor, or a combination of a variable capacitor and a variable inductor. As another example, the pulse controller 111, the processing engine 122, and/or the display 123 may be integrated into an MRI console (not shown). Users may set parameters in MRI scanning, control the imaging procedure, and view the images produced through the MRI console. However, those variations and modifications do not depart the scope of the present disclosure.

Figure 12:
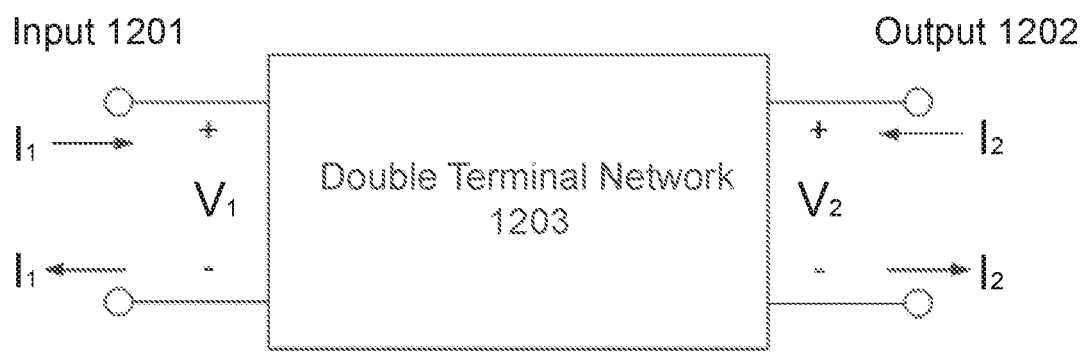
FIG. 12 is a schematic diagram illustrating an exemplary double terminal network according to some embodiments of the present disclosure.

FIG. 12 is a schematic diagram illustrating an exemplary double terminal network according to some embodiments of the present disclosure. As shown in FIG. 12, the double terminal network 1200 may include an input 1201 and an output 1202.

Merely by way of example, the input 1201 and the output 1202 may be expressed as:

$$\begin{bmatrix} V_1 \\ V_2 \end{bmatrix} = \begin{bmatrix} z_{11} & z_{12} \\ z_{21} & z_{22} \end{bmatrix} \begin{bmatrix} I_1 \\ I_2 \end{bmatrix} \quad (1)$$

where $V_1$ may denote the voltage of the input 1201, $V_2$ may denote the voltage of the output 1202, $I_1$ may denote the current of the input 1201, $I_2$ may denote the current of the output 1202, and $z_{11}$, $z_{12}$, $z_{21}$ and $z_{22}$ may denote impedances between the input 1201 and the output 1202.

Merely by way of example, the impedances between the input 1201 and the output 1202 may be determined by:

$$z_{11} \overset{def}{=} \frac{V1}{I_1}\bigg|_{I_2=0} \qquad (2)$$

$$z_{12} \overset{def}{=} \frac{V1}{I_2}\bigg|_{I_1=0} \qquad (3)$$

$$z_{21} \overset{def}{=} \frac{V2}{I_1}\bigg|_{I_2=0} \qquad (4)$$

$$z_{22} \overset{def}{=} \frac{V2}{I_2}\bigg|_{I_1=0} \qquad (5)$$

By measuring the voltage and current of the amplifier, the input impedance and the output impedance of the amplifier may be calculated as complex values according to the formulae (2) to (5). The variable components (e.g., C1, C2, C3, C6, etc.) in the amplifying circuit 1100 may then be adjusted to remove the imaginary part of the complex impedances.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, three or more groups of pixels may be connected to a same signal transmission board. However, those variations and modifications do not depart the scope of the present disclosure.

It should be noted that the above description of the embodiments are provided for the purposes of comprehending the present disclosure, and not intended to limit the scope of the present disclosure. For persons having ordinary skills in the art, various variations and modifications may be conducted in the light of the present disclosure. However, those variations and the modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "block," "module," "engine," "unit," "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a frame wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2008, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities of ingredients, properties, and so forth, used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

It is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and describe.

What is claimed is:

1. A magnetic resonance coil, comprising:
   an antenna configured to receive a radio frequency (RF) signal emitted from an object, wherein the antenna does not resonate with the RF signal;
   a signal processor coupled to the antenna configured to process the RF signal to generate a processed signal, wherein the signal processor comprises:
   an amplifier coupled to the antenna configured to amplify the RF signal; and
   an adjusting circuit coupled to the amplifier configured to adjust the magnitude of the imaginary part of an impedance of the amplifier.

2. The magnetic resonance coil of claim 1, wherein the antenna is a non-resonant antenna.

3. The magnetic resonance coil of claim 1, wherein the antenna is made of one or more deformable conductive materials.

4. The magnetic resonance coil of claim 1, wherein the antenna is a birdcage structure configured to receive the RF signal from an entire body of the object.

5. The magnetic resonance coil of claim 1, wherein the antenna is a loop structure configured to receive the RF signal from a portion of the object.

6. The magnetic resonance coil of claim 1, wherein
   the amplifier has an input port and an output port, and
   the adjusting circuit includes at least one of an input adjusting circuit or an output adjusting circuit, wherein
   the input adjusting circuit is coupled to the input port of the amplifier and configured to adjust the magnitude of the imaginary part of an input impedance of the amplifier, and
   the output adjusting circuit is coupled to the output port of the amplifier and configured to adjust the magnitude of the imaginary part of an output impedance of the amplifier.

7. The magnetic resonance coil of claim 6, wherein
   the input adjusting circuit includes a first adjustable component, the magnitude of the imaginary part of the input impedance of the amplifier is adjusted by adjusting at least one of the capacitance or the inductance of the first adjustable component, and
   the output adjusting circuit includes a second adjustable component, the magnitude of the imaginary part of the output impedance of the amplifier is adjusted by adjusting at least one of the capacitance or the inductance of the second adjustable component.

8. The magnetic resonance coil of claim 1, wherein the amplifier is a differential amplifier.

9. The magnetic resonance coil of claim 1, further comprising:
   a matching circuit coupled between the antenna and the amplifier and configured to match an impedance of the antenna and an impedance of the amplifier.

10. The magnetic resonance coil of claim 9, wherein the matching circuit is a broadband matching circuit that matches the impedance of the antenna and the impedance of the amplifier over a frequency range of the broadband signals.

11. The magnetic resonance coil of claim 1, wherein the adjusting circuit includes at least one of a variable capacitor or a variable conductor.

12. The magnetic resonance coil of claim 1, wherein the signal processor further comprises a filter coupled to the amplifier.

13. The magnetic resonance coil of claim 1, wherein the signal processor further comprises a heterodyne receiver or a homodyne receiver coupled to the amplifier.

14. The magnetic resonance coil of claim 1, wherein the signal processor is a direct sampling structure, the signal processor comprising:
an analog-to-digital converter configured to convert the RF signal to a digital signal.

15. The magnetic resonance coil of claim 1, wherein the antenna is configured without capacitive elements on conductive materials.

16. The magnetic resonance coil of claim 1, wherein the antenna is configured with no impedance matching circuit.

17. The magnetic resonance coil of claim 1, wherein the amplifier is configured with an input impedance greater than 500 Ohms.

18. The magnetic resonance coil of claim 1, wherein the antenna is configured with no coupling unit, nor decoupling unit.

19. The magnetic resonance coil of claim 1, wherein the magnetic resonance coil is implemented in a multi-nuclear magnetic resonance system relating to a plurality of atomic nuclei, the plurality of atomic nuclei comprising: phosphorus atom or sodium atom.

20. A magnetic resonance imaging (MRI) system, comprising:
a main electromagnet configured to generate a uniform magnetic field on an object;
a gradient electromagnet configured to generate a gradient magnetic field on the object;
a transmitting coil configured to transmit a first radio frequency (RF) signal to the object;
a receiving coil configured to receive and process a second RF signal emitted from the object in response to the first RF signal, the receiving coil including:
an antenna configured to receive a radio frequency (RF) signal emitted from an object, wherein the antenna does not resonate with the RF signal; and
a signal processor coupled to the antenna configured to process the RF signal to generate a processed signal;
a processor configured to generate an image of the object based on the processed signal; and
a display configured to display the generated image of the object, wherein the signal processor comprises:
an amplifier coupled to the antenna configured to amplify the RF signal, and
an adjusting circuit coupled to the amplifier configured to adjust the magnitude of the imaginary part of an impedance of the amplifier.

* * * * *